United States Patent
Park et al.

(10) Patent No.: US 7,355,912 B2
(45) Date of Patent: Apr. 8, 2008

(54) AUTO-PRECHARGE CONTROL CIRCUIT IN SEMICONDUCTOR MEMORY AND METHOD THEREOF

(75) Inventors: Sang-Kyun Park, Seoul (KR); Ho-Cheol Lee, Yongin (KR)

(73) Assignee: Samsung Electronics, Co., Ltd., Gyeonggi-do (KR)

( * ) Notice: Subject to any disclaimer, the term of this patent is extended or adjusted under 35 U.S.C. 154(b) by 0 days.

(21) Appl. No.: 10/268,732

(22) Filed: Oct. 11, 2002

(65) Prior Publication Data
US 2003/0185075 A1 Oct. 2, 2003

(30) Foreign Application Priority Data
Apr. 1, 2002 (KR) ............... 10-2002-0017757

(51) Int. Cl.
*G11C 7/00* (2006.01)
(52) U.S. Cl. .............. 365/203; 365/233; 365/189.01; 365/189.05
(58) Field of Classification Search ........ 365/203, 365/233, 194, 189.12, 189.05, 189.01; 711/105, 711/106
See application file for complete search history.

(56) References Cited

U.S. PATENT DOCUMENTS

| | | | |
|---|---|---|---|
| 5,587,961 A | 12/1996 | Wright et al. | |
| 5,748,560 A | 5/1998 | Sawada | 365/223 |
| 5,896,545 A | 4/1999 | Barth et al. | |
| 5,995,438 A * | 11/1999 | Jeng et al. | 365/230.03 |
| RE36,532 E | 1/2000 | Kim | 365/203 |
| 6,058,069 A | 5/2000 | Ting et al. | |
| 6,061,285 A | 5/2000 | Tsukikawa | |
| 6,185,141 B1 | 2/2001 | Hoshita et al. | |
| 6,215,711 B1 | 4/2001 | Kim | 365/193 |
| 6,242,936 B1 | 6/2001 | Ho et al. | |
| 6,246,614 B1 | 6/2001 | Ooishi | |
| 6,275,437 B1 | 8/2001 | Kim et al. | |
| 6,343,036 B1 | 1/2002 | Park et al. | |
| 6,343,040 B2 | 1/2002 | Bae | 365/203 |
| 6,353,573 B1 | 3/2002 | Koshikawa | |
| 6,356,494 B2 * | 3/2002 | Jang et al. | 365/203 |
| 6,434,082 B1 * | 8/2002 | Hovis et al. | 365/233 |
| 6,507,526 B2 * | 1/2003 | Ohtake | 365/203 |

(Continued)

FOREIGN PATENT DOCUMENTS

JP 2000-322886 11/2000

(Continued)

OTHER PUBLICATIONS

Office Action for corresponding German Application No. 10307244.6 dated Jan. 15, 2007.

*Primary Examiner*—David Lam
(74) *Attorney, Agent, or Firm*—Harness, Dickey & Pierce, P.L.C.

(57) ABSTRACT

An auto-precharge control circuit in a semiconductor memory and method thereof, where the auto-precharge starting point may vary. The auto-precharge starting point may vary in response to at least one control signal. The auto-precharge starting point may vary in accordance with frequency and/or latency information. The auto-precharge starting point may vary in response to at least one control signal including clock frequency information. The auto-precharge starting point may vary depending on a latency signal received from a mode register setting command.

44 Claims, 14 Drawing Sheets

U.S. PATENT DOCUMENTS

| | | | |
|---|---|---|---|
| 6,532,188 B2 * | 3/2003 | Dietrich et al. | 365/233 |
| 6,538,924 B2 * | 3/2003 | Dono et al. | 365/185.08 |
| 6,661,721 B2 * | 12/2003 | Lehmann et al. | 365/203 |
| 2001/0024382 A1 | 9/2001 | Shimoyama et al. | |
| 2002/0001247 A1 | 1/2002 | Kim et al. | |

FOREIGN PATENT DOCUMENTS

| | | |
|---|---|---|
| KR | 10-0225947 | 10/1999 |
| TW | 088102038 | 2/1999 |
| TW | 089202023 | 2/2000 |
| WO | WO 97/24727 A1 | 7/1997 |

* cited by examiner

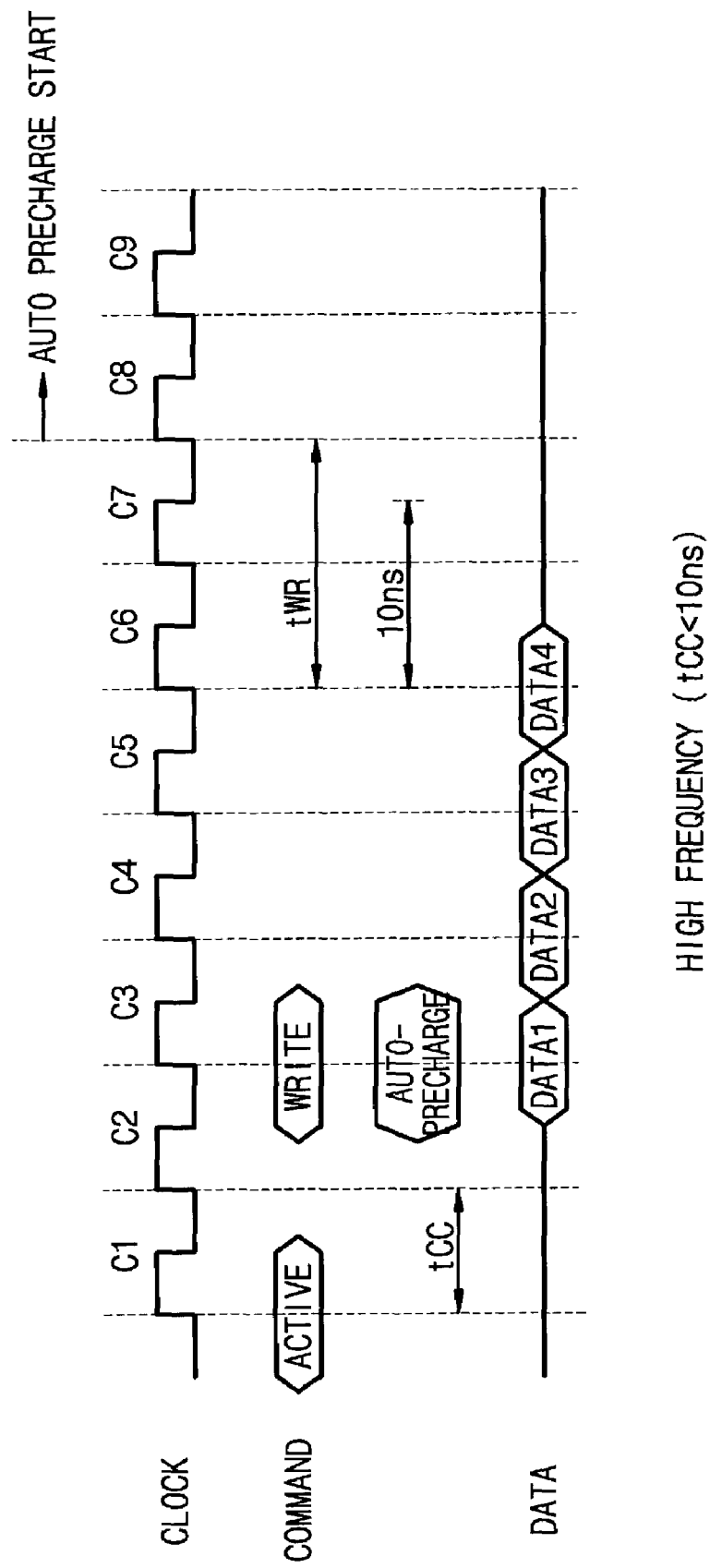

AUTO-PRECHARGE CONTROL CIRCUIT IN SEMICONDUCTOR MEMORY AND METHOD THEREOF

CROSS REFERENCE TO RELATED APPLICATIONS

This U.S. nonprovisional application claims priority under 35 U.S.C. § 119 to Korean Patent Application No. 2002-17757 filed Apr. 1, 2002, the entire contents of which are hereby incorporated by reference.

BACKGROUND OF THE INVENTION

1. Field of the Invention

The present invention relates to an auto-precharge control signal generating circuit and method for a semiconductor memory device, and particularly to an auto-precharge control signal generating circuit and method for a synchronous semiconductor memory that regulates write recovery time.

2. Description of the Related Art

A precharge operation in dynamic random access memories (DRAMs) may be performed on an active bank or chip by asserting a precharge command. The precharge command may be asserted after an active command. A precharge operation may also be performed by an auto-precharge command. Typically, the auto-precharge command is asserted at the same time as a burst read command or burst write command. This is usually accomplished by asserting a logical high on an ADDRESS 10 pin or an AP pin. The auto-precharge with burst write operation is used to perform a precharge operation automatically after a given write recovery time (tWR) from the last data input, after writing the data in an amount indicated by the burst length provided with the read/write command.

The write recovery time tWR may be defined as the minimum number of clock cycles required to complete a write operation of the last data input and is calculated by dividing tWR by a clock cycle time and rounding up to the next highest integer.

FIG. 1 is a block diagram illustrating a precharge operation in a conventional synchronous dynamic random access memory (SDRAM). In FIG. 1, an SDRAM device 100 includes a memory cell array 110, a word line driver 120, and a precharge control circuit 130. The memory cell array 110 receives a word line signal WL and outputs data DATA. The word line driver 120 outputs the word line signal WL according to an active signal ACTIVE generated from an ACTIVE COMMAND or a PRECHARGE COMMAND. The precharge control circuit 130 receives the active signal ACTIVE, a write signal WRITE generated from a WRITE COMMAND, an auto precharge signal AUTO_PRC generated from an AUTO-PRECHARGE COMMAND and a clock signal CLOCK.

The active signal ACTIVE is generated according to an ACTIVE COMMAND or PRECHARGE COMMAND. The active signal ACTIVE is also generated by the precharge control circuit 130. The clock signal CLOCK is used as the reference for all SDRAM operations. All operations may be synchronized to the positive edge of the clock signal CLOCK.

FIG. 2 is a timing diagram that illustrates the operation of the conventional SDRAM of FIG. 1. At clock cycle C1, the ACTIVE COMMAND is supplied, whereby an internal operation activation designating active signal ACTIVE is rendered active as a memory cell array select operation commence designating signal. In response to the active signal ACTIVE, the word line driver circuit 120 acting as a row related circuit is set to activate a word line signal WL.

At clock cycle C3, a write command WRITE is applied together with a first data input DATA1. FIG. 2 illustrates a case where a burst length is four BL4, which is programmed and determined in a mode register set command timing. The burst write operation is used to write data into the SDRAM on consecutive clock cycles in adjacent internal column addresses which is generated from an internal column address generator depending on the burst length and burst sequence. By asserting a write command with a valid external column address, a burst write operation is initiated. The data inputs are provided for the initial column address in the same clock cycle as the burst write command. The internal column address generator is deselected at the end of the burst length, even though the internal writing is not completed. In response to this write command, a write operation designating signal WRITE is activated and driven to a high-level of the active state. After the write command with a predetermined burst length, the write signal WRITE is driven to a low-level of the inactive state. In the case that the active signal ACTIVE is disabled, the word line signal WL is also disabled, and thus the write operation is not performed on the memory cell array 110.

At clock cycle C7, the precharge command PRECHARGE COMMAND is applied. The active signal ACTIVE is driven to the low-level of the inactive state and then the word line signal WL is driven to the low-level of the inactive state. The time from clock cycle C6 of the last data input DATA4 to clock cycle C7 of the precharge command PRECHARGE COMMAND is called the write recovery time (tWR). Data DATA1 to DATA3 is written to memory cell array block 110. However, it takes a fixed writing time to write the last data DATA4 before the word line signal WL is shut off. Usually this write time includes passing a data input buffer (not shown), passing a data line and bit line (not shown) which have resistance and/or capacitance load. It is assumed that it takes 10 nanoseconds (ns) at minimum to finish writing the last data DATA4.

FIG. 3A is a second timing diagram that illustrates the conventional precharge operation of the block diagram of FIG. 1. FIG. 3A illustrates the high-frequency operation case, where a clock cycle period (tCC) is less than 10 ns. The minimum write time 10 ns is more than the clock cycle period, so tWR should be determined to be two clock cycle periods.

FIG. 3B is a third timing diagram that illustrates the conventional precharge operation of the block diagram of FIG. 1. FIG. 3B illustrates the low-frequency operation case, where a clock cycle period (tCC) is more than 10 ns. The minimum write time 10 ns is less than the clock cycle period, so the tWR should be determined to be one clock cycle period. As illustrated in FIG. 3A, clock cycle C7 is redundant, which decreases the performance of the SDRAM.

FIG. 3C is a fourth timing diagram that illustrates the conventional auto-precharge operation of the block diagram of FIG. 1. At clock cycle C3, a write command WRITE is applied together with an auto-precharge command AUTO-PRECHARGE COMMAND. The auto-precharge operation begins at clock cycle C8. FIG. 3C illustrates the high-frequency operation case, where a clock cycle period (tCC) is less than 10 ns. The minimum write time 10 ns is more than the clock cycle period so tWR should be determined to be two clock cycle periods.

FIG. 3D is a fifth timing diagram that illustrates the conventional auto-precharge operation of the block diagram of FIG. 1. FIG. 3D illustrates the low-frequency operation case, where a clock cycle period (tCC) is more than 10 ns. The minimum write time 10 ns is less than the clock cycle period, so tWR should be determined to be one clock cycle period. As illustrated in FIG. 3D, clock cycle C7 is redundant, which decreases the performance of the SDRAM.

SDRAMs employing other conventional auto-precharge operations are disclosed in U.S. Pat. Nos. 6,343,040, 6,215,711, 5,748,560, and Re36,532.

SUMMARY OF THE INVENTION

In an exemplary embodiment, the present invention is directed to an auto-precharge control circuit in a semiconductor memory and method thereof, where the auto-precharge starting point may vary. In another exemplary embodiment, the present invention is directed to an auto-precharge control circuit in a semiconductor memory and method thereof, where the auto-precharge starting point may vary in response to at least one control signal.

In another exemplary embodiment, the present invention is directed to an auto-precharge control circuit in a semiconductor memory and method thereof, where the auto-precharge starting point may vary in accordance with frequency and/or latency information.

In another exemplary embodiment, the present invention is directed to an auto-precharge control circuit in a semiconductor memory and method thereof, where the auto-precharge starting point may vary in response to at least one control signal including clock frequency information.

In another exemplary embodiment, the present invention is directed to an auto-precharge control circuit in a semiconductor memory and method thereof, where the auto-precharge starting point may vary depending on a latency signal received from a mode register setting (MRS) command.

In another exemplary embodiment, the present invention is directed to an auto-precharge control circuit including a control circuit for receiving a write signal, a clock signal and at least one control signal, including at least one of clock frequency information and latency information, and outputting at least one path signal; an auto-precharge pulse signal driver for receiving the at least one path signal, the write signal, and an enable signal and producing an auto-precharge pulse signal, the auto-precharge pulse signal identifying a starting point for an auto-precharge operation; and an auto-precharge mode enabling circuit for receiving the clock signal, an auto-precharge command, an active signal, and the auto-precharge pulse signal and generating the enable signal.

In another exemplary embodiment, the present invention is directed to a method of performing an auto-precharge operation, comprising an auto-precharge control step for receiving a write signal, a clock signal and at least one control signal, including at least one of clock frequency information and latency information, and outputting at least one path signal; an auto-precharge pulse signal driving step for receiving the at least one path signal, the write signal, and an enable signal and producing an auto-precharge pulse signal, the auto-precharge pulse signal identifying a starting point for an auto-precharge operation; and an auto-precharge mode enabling step for receiving the clock signal, an auto-precharge command, an active signal, and the auto-precharge pulse signal and generating the enable signal.

BRIEF DESCRIPTION OF THE DRAWINGS

FIG. 3C is a fourth timing diagram that illustrates the conventional auto-precharge operation of the block diagram of FIG. 1 at high frequency.

DETAILED DESCRIPTION OF EXEMPLARY EMBODIMENTS

Exemplary embodiments of the present invention now will be described hereinafter with reference to the accompanying drawings. It is noted that the present invention may be embodied in many different forms.

In exemplary embodiments of the present invention, the auto-precharge starting point may vary depending on frequency and/or latency.

Figure 4:
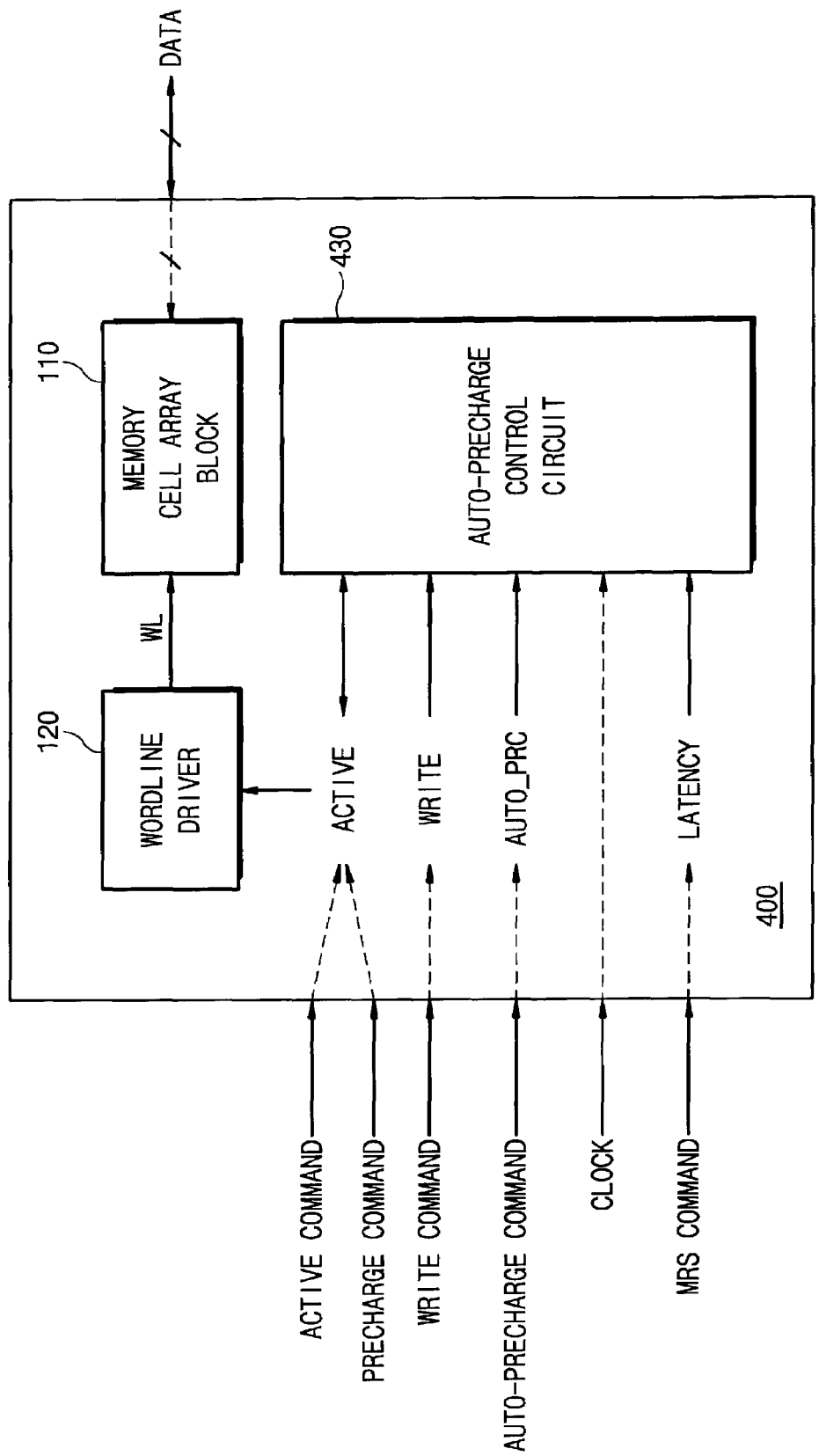
FIG. 4 is a block diagram illustrating an SDRAM in an exemplary embodiment of the present invention.

FIG. 4 is a block diagram illustrating an SDRAM 400 in an exemplary embodiment of the present invention. The SDRAM 400 includes a memory cell array block 110, a wordline driver 120, and an auto-precharge control circuit 430. The SDRAM 400 is capable of receiving commands, which may be supplied externally. These commands may include an ACTIVE COMMAND, a PRECHARGE COMMAND, a WRITE COMMAND, an AUTO-PRECHARGE COMMAND, a CLOCK COMMAND, and a MODE REGISTER SETTING (MRS) COMMAND.

The SDRAM 400 may generate one or more signals from these commands, which are supplied to one or elements of the SDRAM 400. For example, the SDRAM 400 may generate an ACTIVE signal and supply the ACTIVE signal to the wordline driver 120 and/or the auto-precharge control circuit 430, in response to the ACTIVE COMMAND and/or the PRECHARGE COMMAND. The SDRAM 400 may also generate a WRITE signal and supply the WRITE signal to the auto-precharge control circuit 430, in response to the WRITE COMMAND. The SDRAM 400 may also generate an AUTO-PRC signal and supply the AUTO-PRC signal to the auto-precharge control circuit 430, in response to the AUTO-PRECHARGE COMMAND. The SDRAM 400 may also generate a LATENCY signal and supply the LATENCY signal to the auto-precharge control circuit 430, in response to the MRS COMMAND.

The wordline driver 120 may generate a wordline (WL) signal and supply the WL signal to the memory cell array block 110. The memory cell array block 110 reads DATA in and writes DATA out.

The latency signal LATENCY may contain information for an operation frequency of a semiconductor memory, such as a DRAM or SDRAM, usually established by column-address-strobe (CAS) latency (CL) information. Table 1 illustrates an exemplary relationship between CL, frequency, and write recovery time (tWR).

TABLE 1

| CL | the highest clock frequency | tWR (based on the number of clock cycle) |
|---|---|---|
| 1 | 40 MHz | 1 |
| 2 | 100 MHz | 1 |
| 3 | 133 MHz | 2 |

Figure 5A:
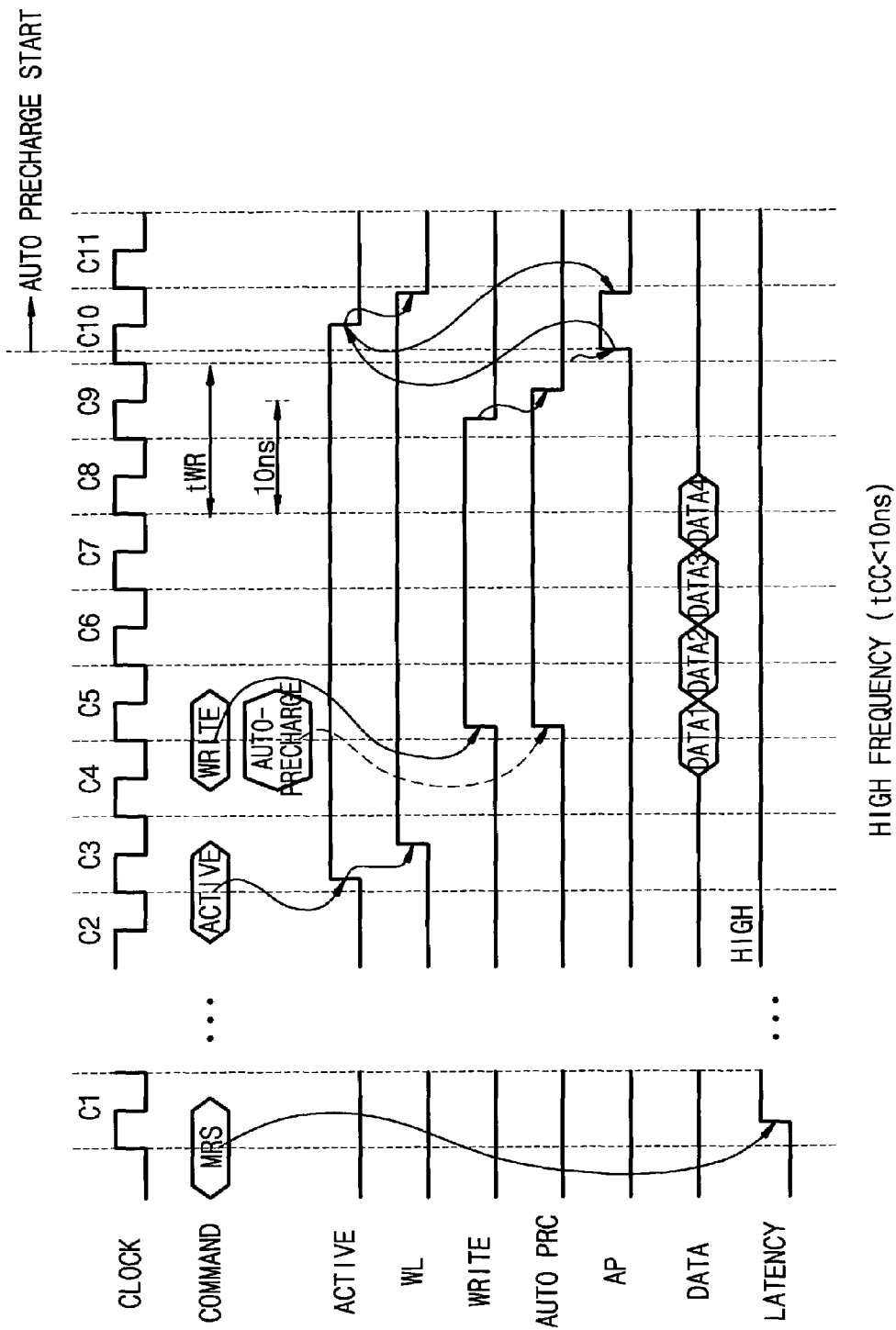
FIG. 5A is a timing diagram that illustrates the auto-precharge operation of the block diagram of FIG. 4 in an exemplary embodiment of the present invention.
Figure 5B:
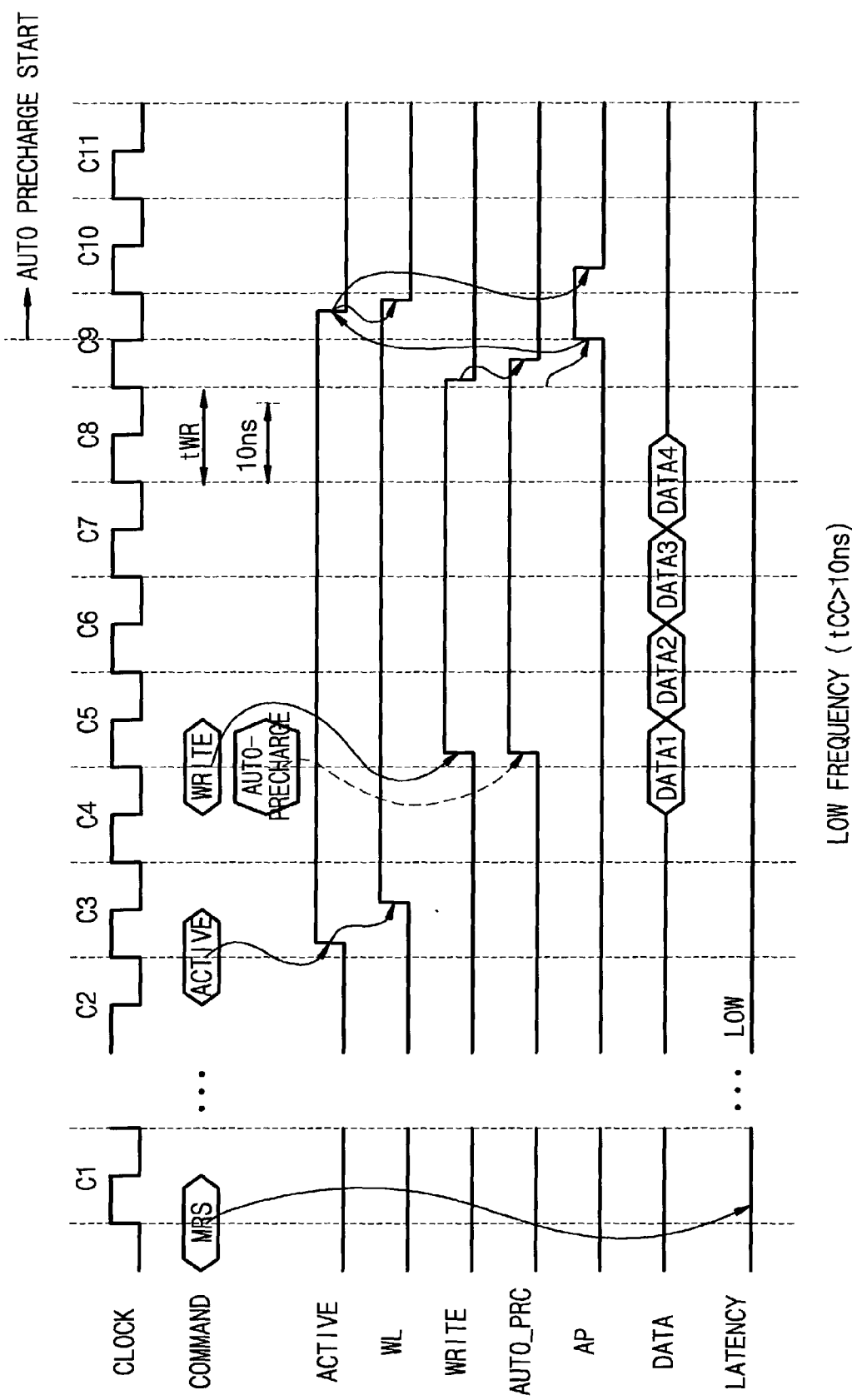
FIG. 5B is a timing diagram that illustrates the auto-precharge operation of the block diagram of FIG. 4 at low frequency in an exemplary embodiment of the present invention.

Regarding auto-precharge operations, in an exemplary embodiment of the present invention, the auto-precharge starting point may be varied according to the latency signal LATENCY received from the MRS COMMAND. The auto-precharge control circuit 430 according to exemplary embodiments, responds to the latency signal LATENCY, which may be determined to be a first logic level at a high clock frequency and a second logic level at a low clock frequency. For example, when the CL is 2, the auto-precharge starting point is the next clock after the last data input DATA4, as shown in FIG. 5a. When the CL is 3, the auto-precharge starting point is the second clock after the last data input DATA4 as shown in FIG. 5b.

Figure 6:
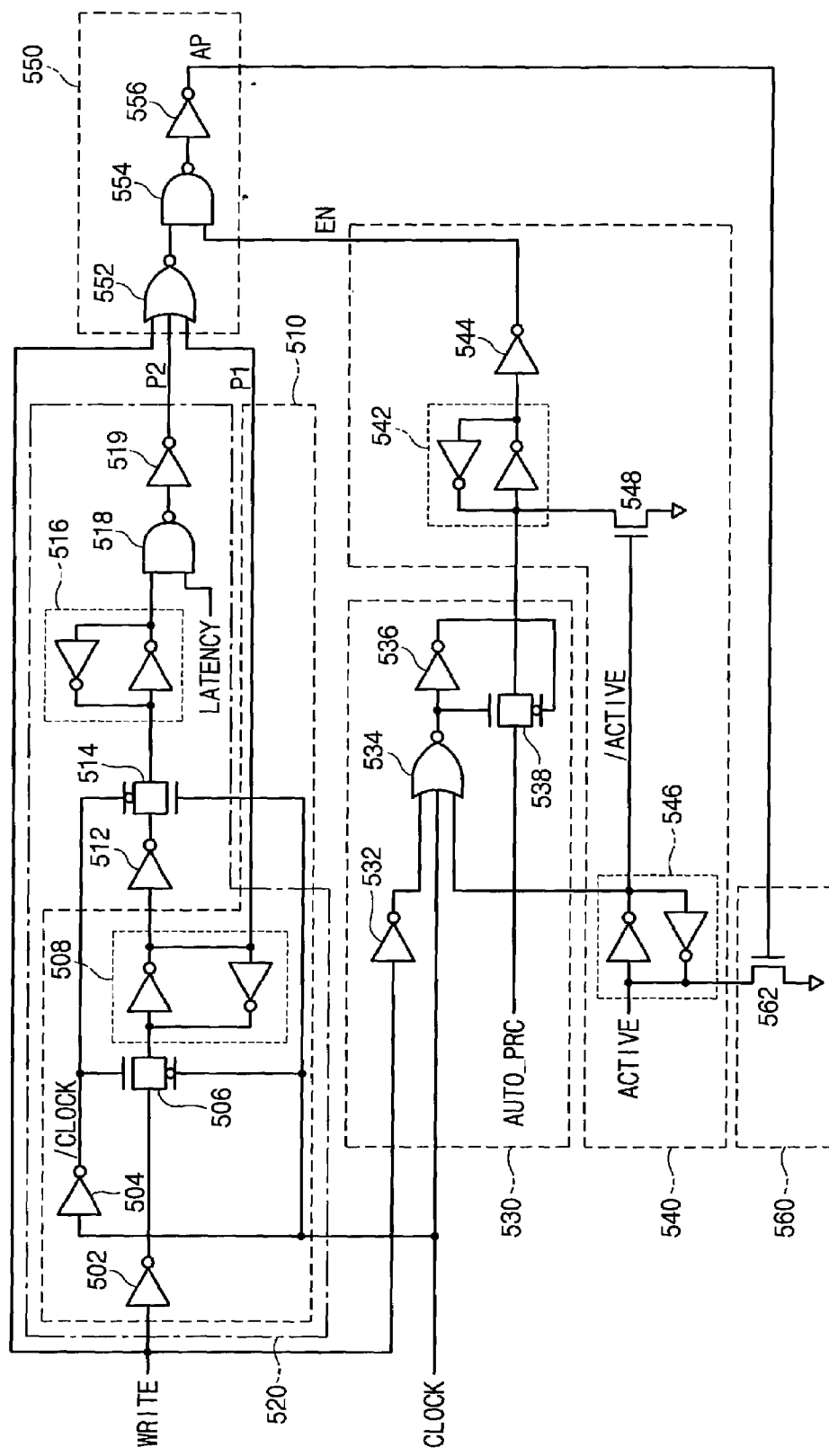
FIG. 6 is a circuit diagram illustrating the auto-precharge control circuit of FIG. 4 in an exemplary embodiment of the present invention.

FIG. 6 is an exemplary circuit diagram illustrating the auto-precharge control circuit 430 of FIG. 4 in more detail. The circuit of FIG. 6 is an exemplary circuit for realizing an auto-precharge function according to the various embodiments of the present invention. As illustrated in the exemplary embodiment of FIG. 6. the auto-precharge control circuit 430 includes a first circuit path 510, a second circuit path 520, an auto-precharge operation selector 530, an auto-precharge enabling circuit 540, an auto-precharge pulse (AP) signal generator 550, and a feedback signal generator 560.

As illustrated in FIGS. 4 and 6, the write signal WRITE, the auto precharge signal AUTO_PRC, the latency signal LATENCY, the active signal ACTIVE, and the clock signal CLOCK are all inputs to the auto-precharge control circuit 430. As also illustrated in FIG. 6, the first path 510 includes an inverter 502 for receiving and inverting the write signal WRITE, a switch 506 triggered by the clock signal CLOCK, and a latch circuit 508, acting as a register, and generates an output signal P1 in response to the clock signal CLOCK. The switch 506 is triggered by the falling edge of the clock signal CLOCK.

The second path 520 includes the first path 510, two inverters 512, 519, a switch 514 triggered by the clock signal CLOCK, a latch circuit 516, acting as a register, and an NAND gate 518 receiving the latency signal LATENCY and the latch signal from the latch circuit 516. The second path 520 generates an output signal P2 in response to the clock signal CLOCK. The switch 514 is triggered by the leading edge of the clock signal CLOCK.

Auto-precharge operations delay the write signal WRITE corresponding to the burst length by a fixed number of clock cycles according to the tWR, and generate an auto-precharge control signal AP by combining the delayed signals from the first path 510 and/or the second path 520 and the write signal WRITE.

The auto precharge pulse signal (AP) generator 550 includes a NOR gate 552, which receives the delayed signals from the first path 510 and/or the second path 520, and the write signal WRITE, a NAND gate 554, which receive an output of the NOR gate 552 and an enable signal EN from the AUTO_PRC enabling circuit 540, and an inverter 556, which inverts an output of the NOR gate 552 to produce an auto-precharge pulse (AP) signal.

The auto precharge operation selector 530 includes an inverter 532 generating an inverted write signal WRiTE and a switch 538 triggered by a summing signal generated from a NOR 534. The NOR gate 534 receives the inverted write signal WRITE, the clock signal CLOCK and an input signal from the AUTO—PRC enabling circuit 540. An output of the NOR 534 is input to an inverter 536. If all of the input signals to the NOR 534 gate are low-level, the switch 538 turns on and passes the AUTO—PRC signal to an inverting latch circuit 542 of the AUTO—PRC enabling circuit 540.

The auto precharge enabling circuit 540 includes a latch circuit 546 latching the active signal ACTIVE and generating an output signal/ACTIVE, an NMOS transistor 548 whose gate terminal is connected to the output signal /ACTIVE of the latch circuit 546 and coupled to ground voltage, VSS and a second latch circuit 542, latching the auto precharge signal AUTO_PRC passed through the switch 538 and generating the enable signal EN via an inverter 544.

The feedback signal generator 560 includes an NMOS transistor 562, whose gate terminal is connected to the AP signal generated from the auto-precharge pulse signal generator 550 and coupled to ground voltage, VSS. When the AP signal is high-level, the NMOS transistor 562 turns on and the active signal ACTIVE goes low-level.

FIG. 5A is a timing diagram showing an operation according to an auto-precharge method in an exemplary embodiment of the present invention, operating under the following conditions: the clock is more than 100 MHz, the burst length is 4 and CL is 3. During clock cycle C1 of a power-up sequence, the MRS COMMAND is applied to the DRAM 400 and determines the DRAM 400 to operate in a mode where CL is 3 as shown in FIG. 5A.

A mode register (not shown) may store the data for controlling the various operating modes of the DRAM 400. The mode register programs the CL, burst type, burst length, test mode and various vendor specific options to make the DRAM 400 useful for a variety of different applications. The default value of the mode register is typically not defined, therefore the mode register may be written after power-up to operate the DRAM 400. Two clock cycles are typically required to complete the write in the mode register. The mode register contents can be changed using the same command and clock cycle requirements during operation as long as all banks are in the idle state. The mode register may be programmed after power-on and before normal operation. In addition, the mode register may also be changed during normal operations.

FIG. 5A shows the case where the latency signal LATENCY is high-level. The latency signal LATENCY is high-level, for example, when the frequency is greater then 100 MHz (tCC is less than 10 ns). At a clock cycle C3 during an operation mode, the ACTIVE command is applied, which generates the ACTIVE signal and then enables the WL signal at a high-level (active state). The write command WRITE is applied together with the auto-precharge command AUTO-PRECHARGE at clock cycle C5, two clock cycles after the ACTIVE command. The WRITE signal is then activated to the high-level. After the burst data inputs DATA1 to DATA4, the write signal WRITE goes to a low-level (inactive state).

According to the next clock rising edge of the low-level of the WRITE signal, the AP signal goes to the high-level. The AP signal turns on the NMOS transistor 562, and then the ACTIVE signal goes to the low-level. The output of the latch circuit 546 goes to the high-level, and then turns on the NMOS transistor 548. The input of the latch circuit 542 goes to the low-level, and then the EN signal goes low-level. The AP signal also then goes low-level. As shown in FIG. 5A, the AP signal is a pulse signal (a monostable multivibrator output). The word line signal WL then goes to the low-level in response to the ACTIVE signal also going to the low-level. As shown in FIG. 5A, the starting point of the auto-precharge is clock cycle C10, which is the next clock cycle after the last data input DATA4. The auto-precharge operation also proceeds to inactivate the enabled word line internally in the DRAM 400.

FIG. 5B shows the case where the latency signal LATENCY is low-level. The latency signal LATENCY is low-level, for example, when the frequency is less than 100 MHz (tCC is greater than 10 ns). The timing diagram in FIG. 5B illustrates an auto-precharge operation according to an exemplary embodiment of the present invention, operating under the following conditions: the clock less than 100 MHz, the burst length is 4 and CL is 1 or 2. Most of the operation of FIG. 5B is the same as that of FIG. 5A. Because, in this case, CL is 1 or 2, the latency signal from the MRS COMMAND is set to a low-level. Because the clock cycle is more than the write time, 10 ns, the tWR can be set to be a clock cycle. Therefore, FIG. 5B is different from FIG. 5A in the starting point of the auto-precharge operation; clock cycle C9 in FIG. 5B, as opposed to clock cycle C10 in FIG. 5A. In the case illustrated in FIG. 5B, P2 is set to be low-level as a result of the LATENCY signal being low-level. Therefore, if P1 is low-level in response to the CLOCK signal, the AP signal is enabled to the high-level as shown in FIG. 5B.

Figure 3A:
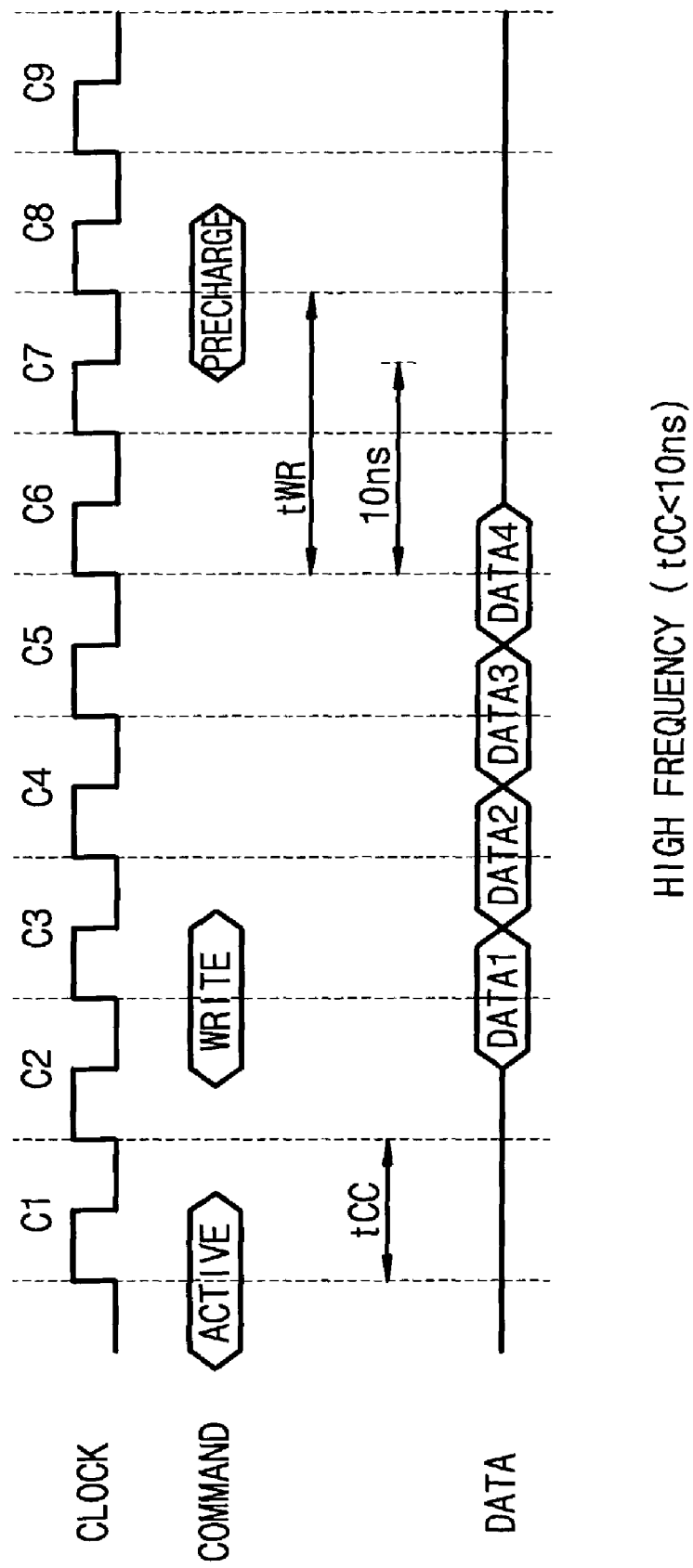
FIG. 3A is a second timing diagram that illustrates the conventional precharge operation of the block diagram of FIG. 1 at high frequency.
Figure 3B:
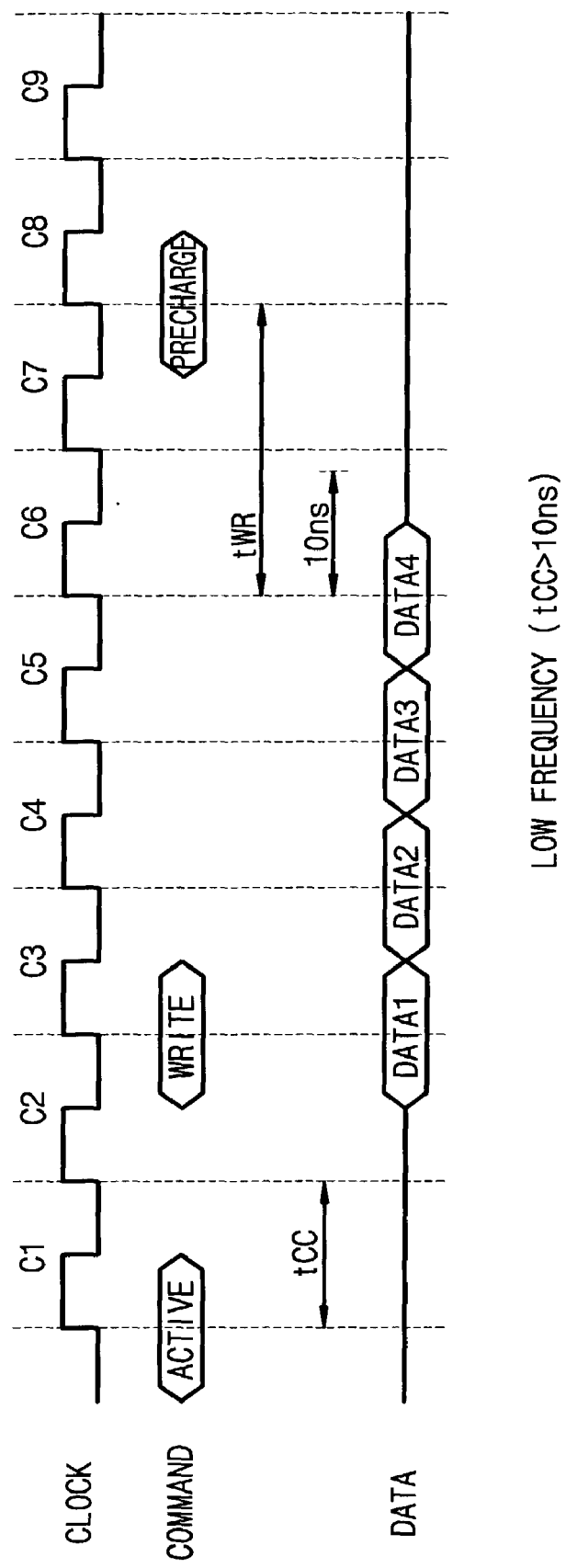
FIG. 3B is a third timing diagram that illustrates the conventional precharge operation of the block diagram of FIG. 1 at low frequency.

Comparing FIGS. 5A and 5B of the present invention and FIGS. 3A-3C of the conventional process, the improvement realized by the various embodiments of the present invention is clear. The operation of the various embodiments of the present invention is essentially the same as the operation of the conventional process in the high frequency mode; both begin the auto-precharge operation at the first available cycle. However, a difference may be seen in the low frequency mode.

Figure 3D:
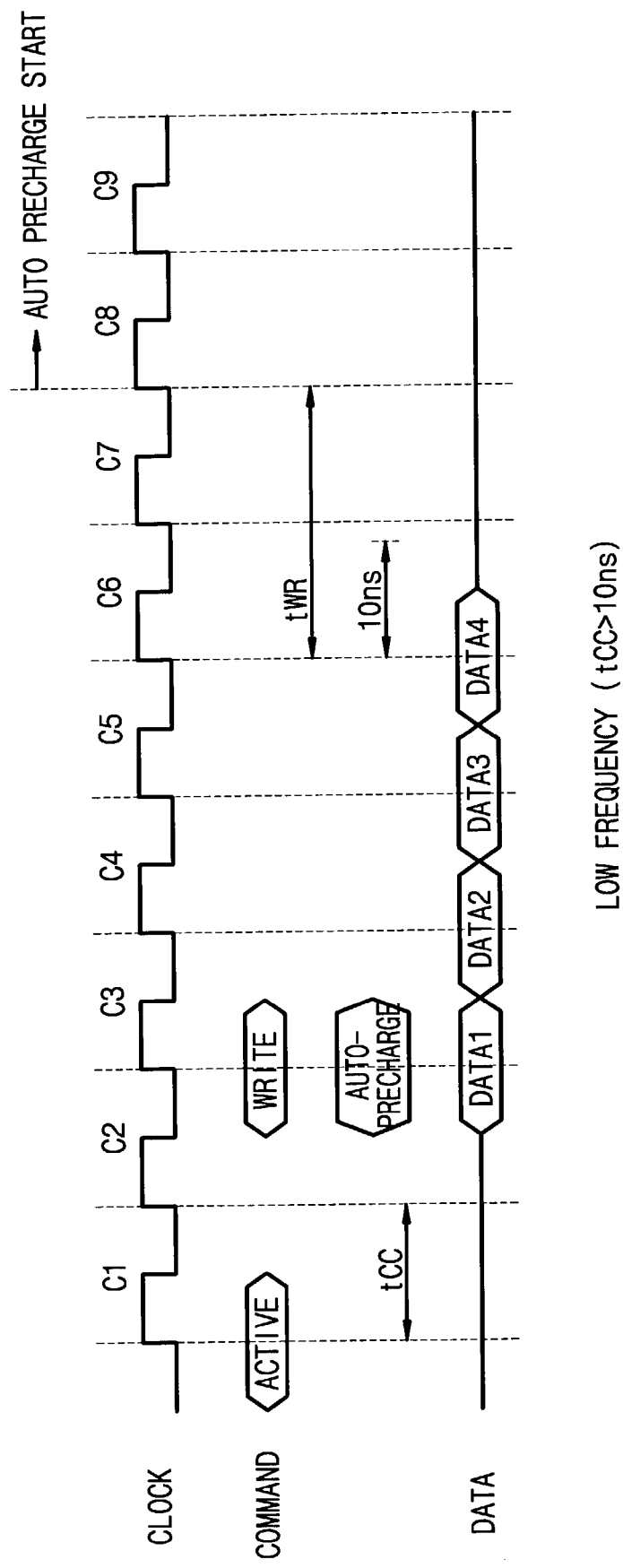
FIG. 3D is a fifth timing diagram that illustrates the conventional auto-precharge operation of the block diagram of FIG. 1 at low frequency.

Comparing FIG. 5B and FIGS. 3B and 3D, clock cycle 7 is wasted in FIGS. 3B and 3D, which reduces the efficiency of the DRAM. Conversely, in the low frequency situation of FIG. 5B clock cycle 9 is not wasted, thereby improving the efficiency of the SDRAM 400. This result is achieved in part by providing an auto-precharge control circuit, which varies the memory write recovery time of the memory device, for example, depending on the frequency and/or the latency of the memory device. By varying the memory write recovery time and therefore the start of an auto-precharge operation, for example, depending on the frequency and/or the latency of the memory device improves the overall efficiency of the memory device.

Figure 8:
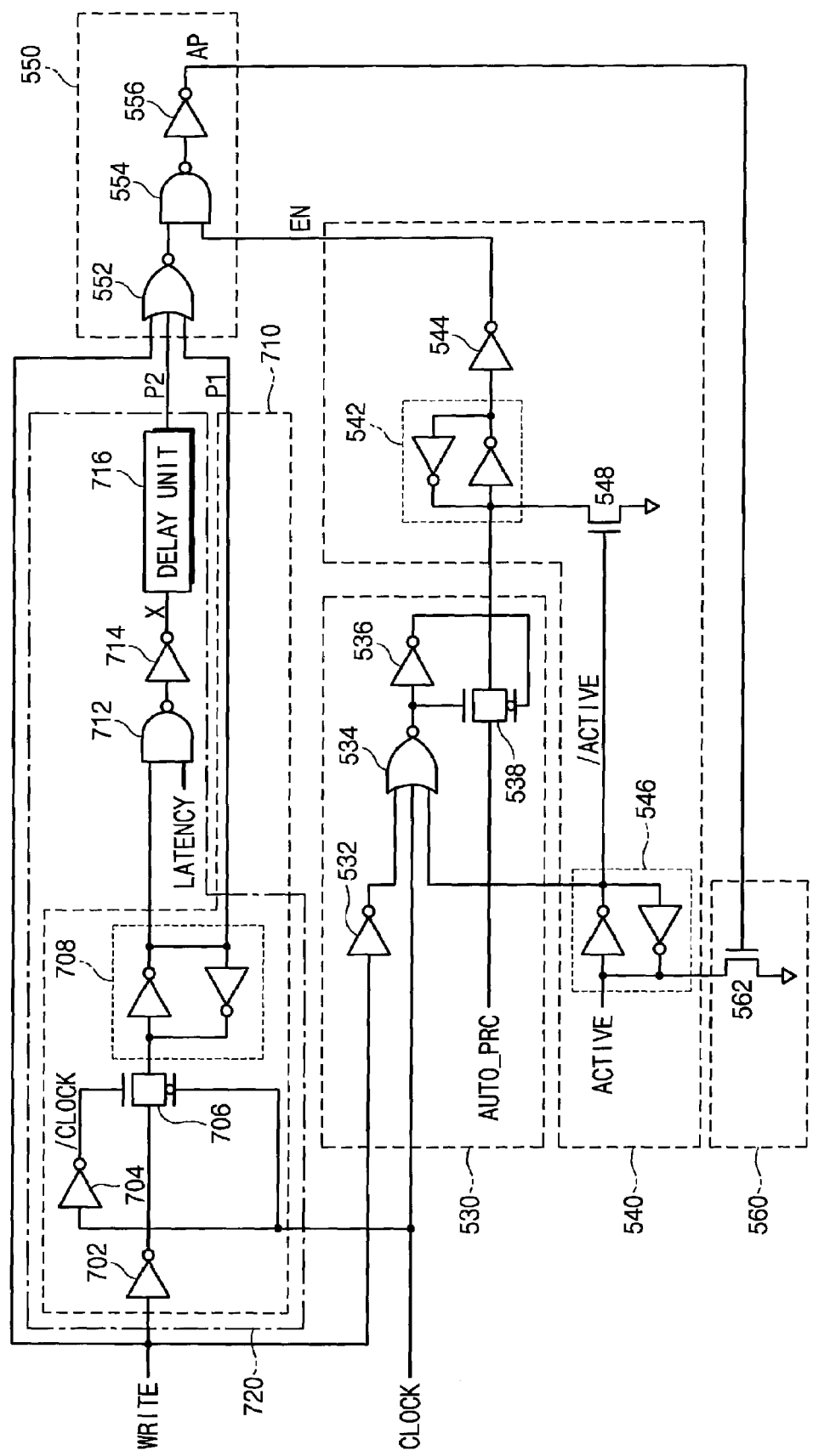
FIG. 8 is a circuit diagram illustrating the auto-precharge control circuit of FIG. 4 in another exemplary embodiment of the present invention.

FIG. 8 is an another exemplary circuit diagram illustrating the auto-precharge control circuit 430 of FIG. 4 in more detail. The exemplary embodiment of FIG. 8 is similar to the exemplary embodiment of FIG. 6 and like elements are referenced to with like reference numerals, and a discussion thereof will be omitted here.

Figure 9:
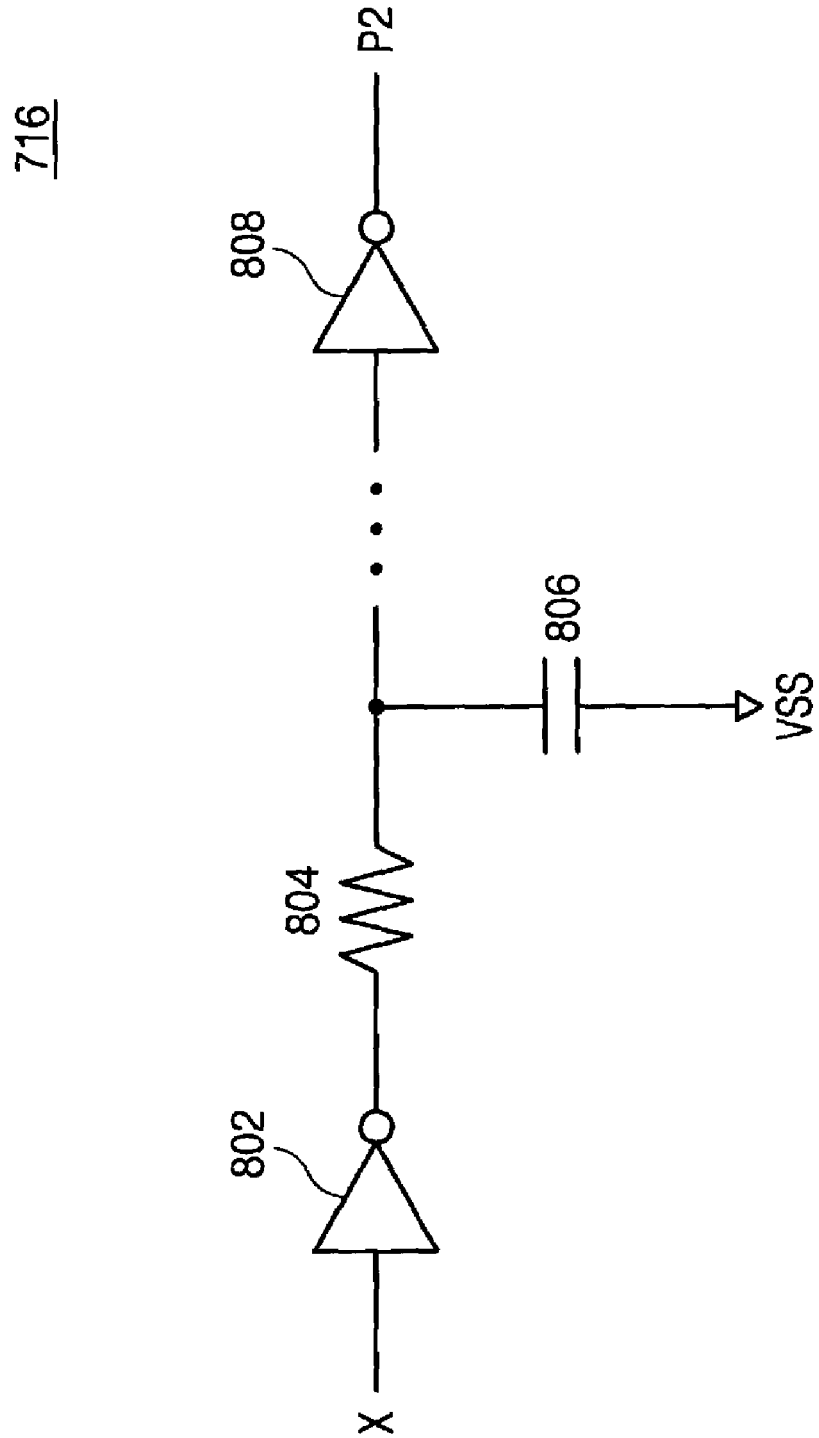
FIG. 9 illustrates a circuit diagram of a delay unit in an exemplary embodiment of the present invention.

The exemplary embodiment of FIG. 8 is different from the exemplary embodiment of FIG. 6 in the circuitry of the second path 520. One or more delay units 716 are added and the inverters 512, 519 of FIG. 6 have been removed. An exemplary circuit diagram of a delay unit 716 is shown in FIG. 9 and include an inverters 802, 808, a resistor 804 and a capacitor 806.

Figure 7:
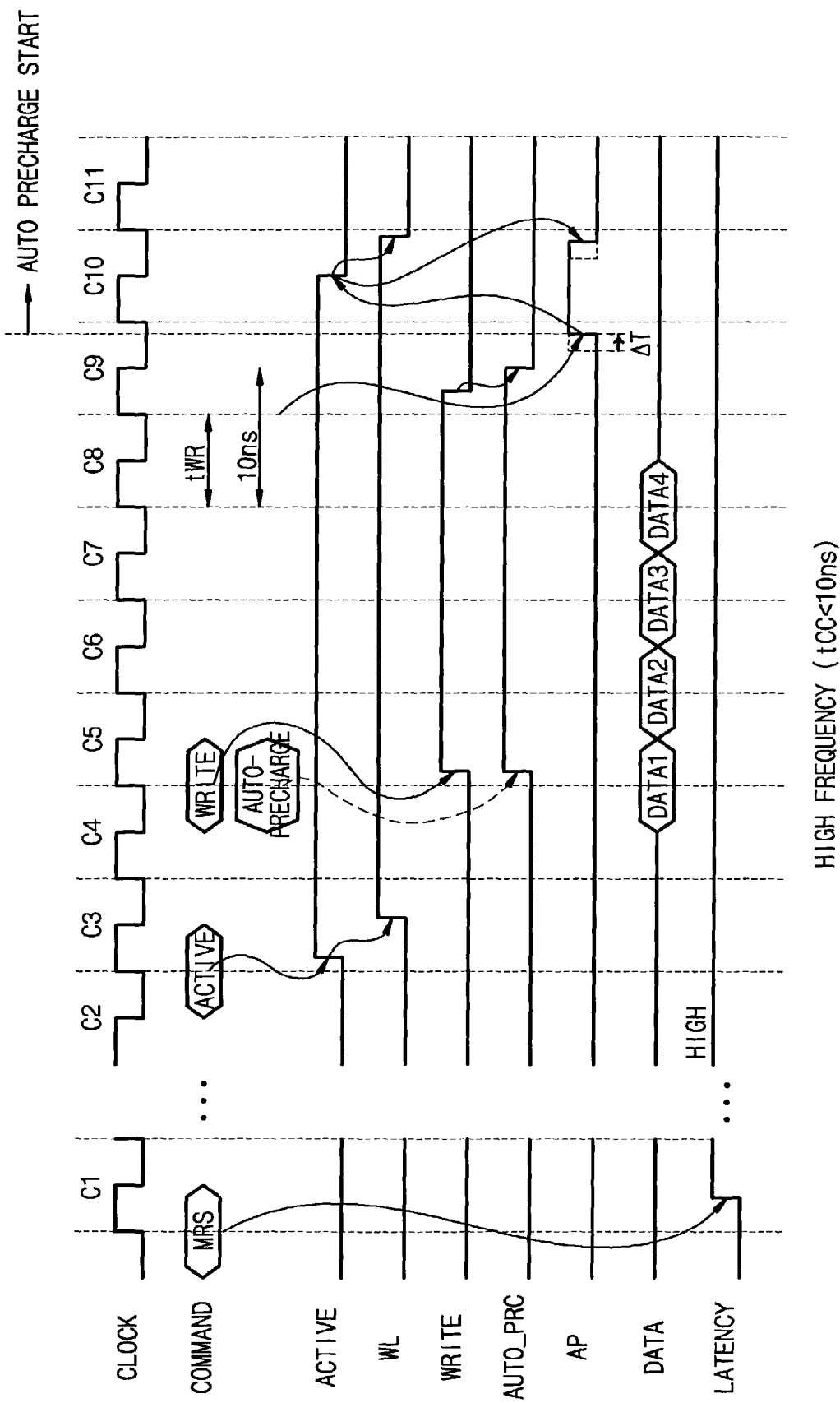
FIG. 7 is a timing diagram showing an auto-precharge operation in another exemplary embodiment of the present invention.

FIG. 7 is a timing diagram showing an operation according to an auto-precharge method in another exemplary embodiment of the present invention, operating under the following conditions: the clock is more than 100 MHz, the burst length is 4 and CL is 3. A delay time of the delay unit 716 is Δt as shown in FIG. 7. The addition of this Δt further ensures the write operation of the last data input DATA4 will be performed properly. The minimum delay time for the write operation of the last data input DATA4 may be added during high-frequency operation where CL is 3.

As described above, in conjunction with the embodiment shown in FIGS. 5-6, by using one or more of the exemplary embodiments of the present invention, the write recovery time tWR may be determined to be one clock cycle across the entire frequency range of interest (for example, the frequency range shown in Table 1).

Figure 10:
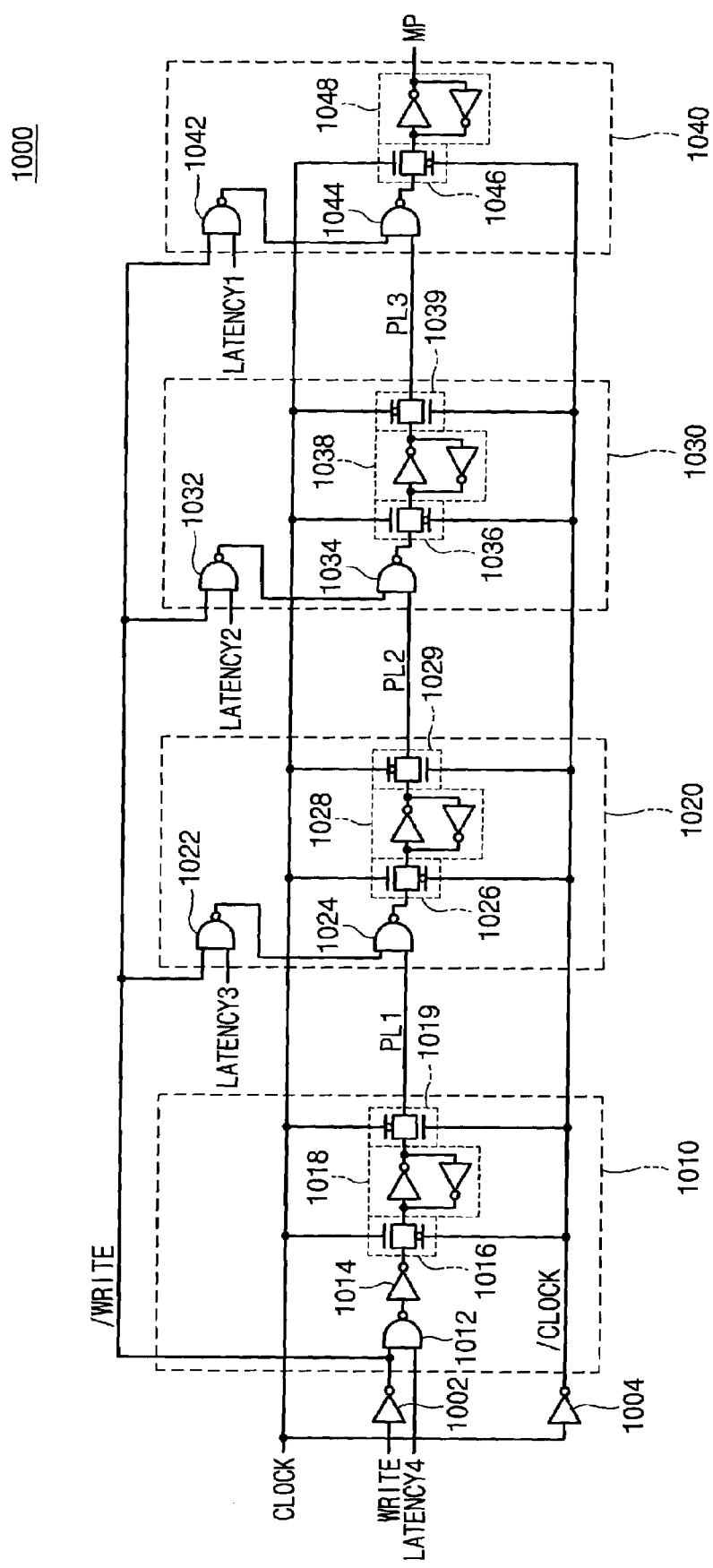
FIG. 10 is a circuit diagram illustrating a variation on the first path and the second path of the auto-precharge control circuit of FIGS. 6 and 8 in an exemplary embodiment of the present invention.

FIG. 10 is an another exemplary circuit diagram illustrating a variation on the first path 510 and the second path 520 of the auto-precharge control circuit 430 of FIGS. 6 and 8. As can been seen from FIGS. 6 and 8, the number of paths, and hence the number of path inputs to the NOR gate 552, is shown as two, although the number of paths in these exemplary embodiment is not limited to two and can be any number.

FIG. 10 illustrates a modification of the first path 510 and the second path 520 of the auto-precharge control circuit 430 of FIGS. 6 and 8 which receives multiple LATENCY signal inputs and produces a single output MP, depending on the LATENCY signal that is selected. As illustrated in FIG. 10, the longer the latency, the higher the frequency.

A path circuit 1000 which receives N (where N is an integer>1) LATENCY signals includes a cascade of N circuits 1010, 1020, 1030, 1040. In the exemplary embodiment of FIG. 10, N=4 for the path circuit 1000.

One of the latency signals LATENCY1 through LATENCY4 is set to a high level while the others are low level, corresponding to which one of the clock frequency conditions is currently in use in the SDRAM 400.

As described above, the path circuit 1000 receives the WRITE signal, the CLOCK signal, and the latency signals LATENCY1-LATENCY4. The patch circuit 1000 includes two inverters 1002 and 1004, for inverting the WRITE signal and the CLOCK signal, respectively and four cascaded circuits in series 1010, 1020, 1030, and 1040. The fourth circuit 1010, includes a NAND gate 1012 for receiving the inverted WRITE signal and the LATENCY4 signal and passes the NANDed output to an inverter 1014. The output of the inverter 1014 is passed to a latch circuit 1018 by switch 1016. The switch 1006 is triggered by the falling edge of the inverse clock signal /CLOCK. The output of the latch circuit 1018 is passed as output signal PL1 to a NAND gate 1024 of the third circuit 1020. The latch circuit 1018 is triggered by the rising edge of the clock signal CLOCK.

The NAND gate 1024 of the third circuit 1020 also receives the output of NAND gate 1022 which performs a NAND operation on the /WRITE signal and the LATENCY3 signal. The output of the NAND gate 1024 is passed to a latch circuit 1028 by switch 1026. The switch 1026 is triggered by the falling edge of the inverse clock signal /CLOCK. The output of the latch circuit 1028 is passed as output signal PL2 to a NAND gate 1034 of the second circuit 1030. The latch circuit 1028 is triggered by the rising edge of the clock signal CLOCK. The remainder of the third circuit 1020 is the same as the fourth circuit 1010, described above.

The output signal PL2 is output by the third circuit 1020 to the second circuit 1030, which also receives the NANDed result of the /WRITE signal and the LATENCY2 signal (NANDed by NAND gate 1032 ). The output of the NAND gate 1034 is passed to a latch circuit 1038 by switch 1036. The switch 1036 is triggered by the falling edge of the inverse clock signal /CLOCK. The output of the latch circuit 1038 is passed as output signal PL3 to a NAND gate 1044 of the first circuit 1040. The latch circuit 1038 is triggered by the rising edge of the clock signal CLOCK.

The output signal PL3 is output by the second circuit 1030 to the first circuit 1040, which also receives the NANDed result of the /WRITE signal and the LATENCY1 signal (NANDed by NAND gate 1042). The output of the NAND gate 1044 is passed to a latch circuit 1048 by switch 1046. The switch 1046 is triggered by the falling edge of the inverse clock signal/CLOCK. The latch circuit 1048 is triggered by the rising edge of the clock signal CLOCK. The output signal MP is output from the first circuit 1040. The output signal NIP indicates the frequency of operation currently employed by the DRAM 400, the LATENCY corresponding to that frequency, and is input to the NOR gate 552 of FIG. 6 or 8, in order to determine the appropriate cycle to start the auto-precharge operation for the current operating frequency.

Referring to FIG. 10, in operation, when LATENCY1 is high-level and LATENCY2-LATENCY4 are low-level, the falling of the WRITE signal is transferred to the output signal MP through a switch 1046.

Similarly, when LATENCY2 is high-level and LATENCY1 and LATENCY3-LATENCY4 are low-level, the falling of the WRITE signal is transferred to the output signal MP through switches 1036, 1039, and 1046. In other words, in case of LATENCY2, the WRITE signal is delayed and transferred by two clock cycles.

Similarly, when LATENCY3 is high-level and LATENCY1-LATENCY2 and LATENCY4 are low-level, the falling of the WRITE signal is transferred to the output signal MP through switches 1026, 1029, 1036, 1039, and 1046. In other words, in case of LATENCY3, the WRITE signal is delayed and transferred by three clock cycles.

Similarly, when LATENCY4 is high-level and LATENCY1-LATENCY3 are low-level, the falling of the WRITE signal is transferred to the output signal MP through switches 1016, 1019, 1026, 1029, 1036, 1039, and 1046. In other words, in case of LATENCY4, the WRITE signal is delayed and transferred by four clock cycles.

As described above, the write time for a given memory device is fixed. However, as described above in conjunction with various embodiments of the present invention, the external input clock cycle time may be variable and the write recovery time tWR and/or the number of clock cycles may be adjusted properly for a given frequency or frequency range.

Further, as described above, in accordance with various embodiments of the present invention, the data writing time can be correctly obtained even when the memory device is operated at a high frequency, thereby precisely writing the data.

Further, as described above, in accordance with various embodiments of the present invention, the write recovery time tWR can be set to be one clock cycle when the memory device is operated at a low frequency, thereby improving the performance of the semiconductor memory device.

It is further noted that the numerous embodiments described above may be modified or extended in several ways. For example, the SDRAM 400 may be another type of DRAM or other semiconductor memory device.

Figure 1:
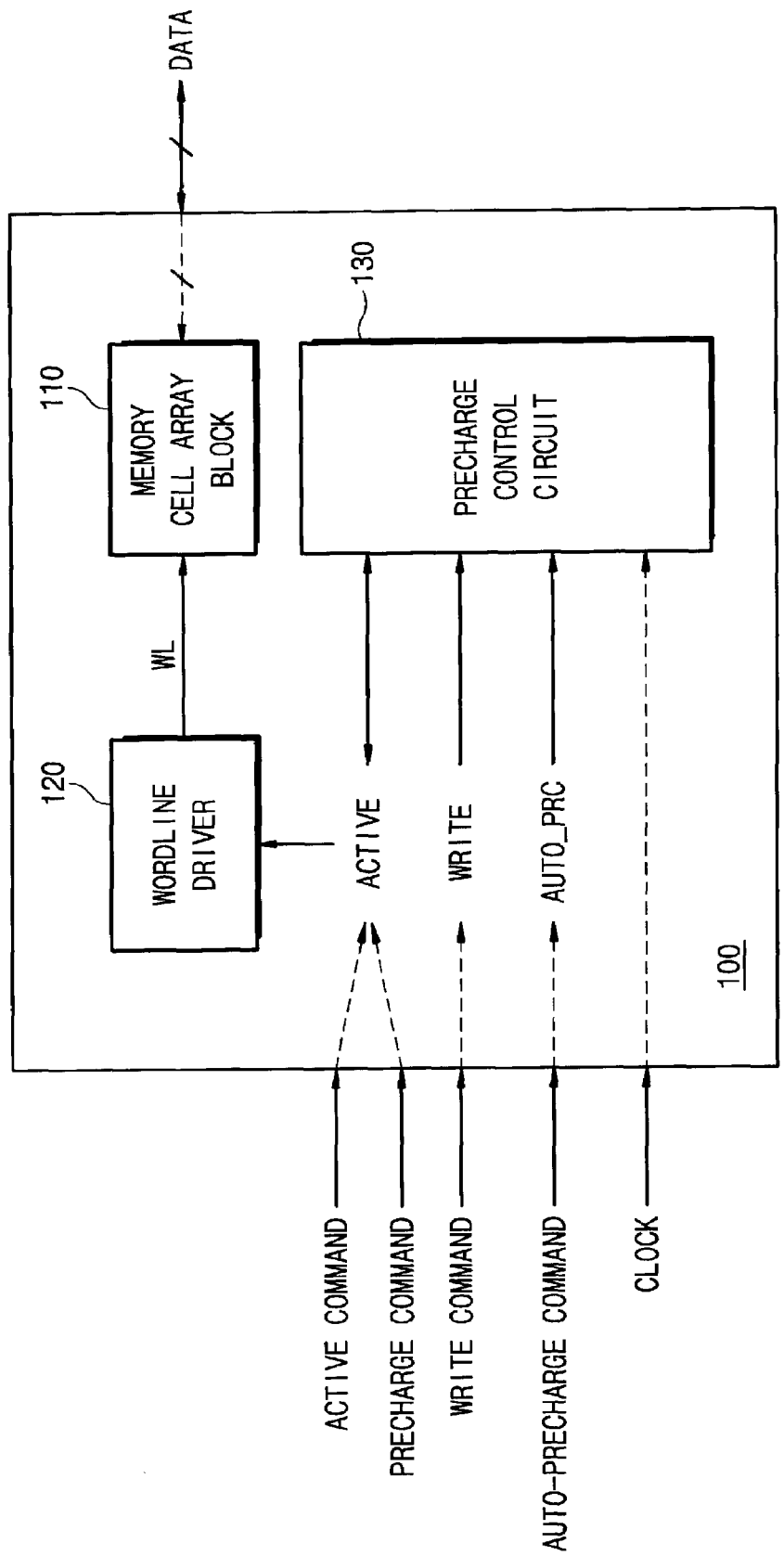
FIG. 1 is a block diagram illustrating a precharge operation in a conventional synchronous dynamic random access memory (SDRAM).
Figure 2:
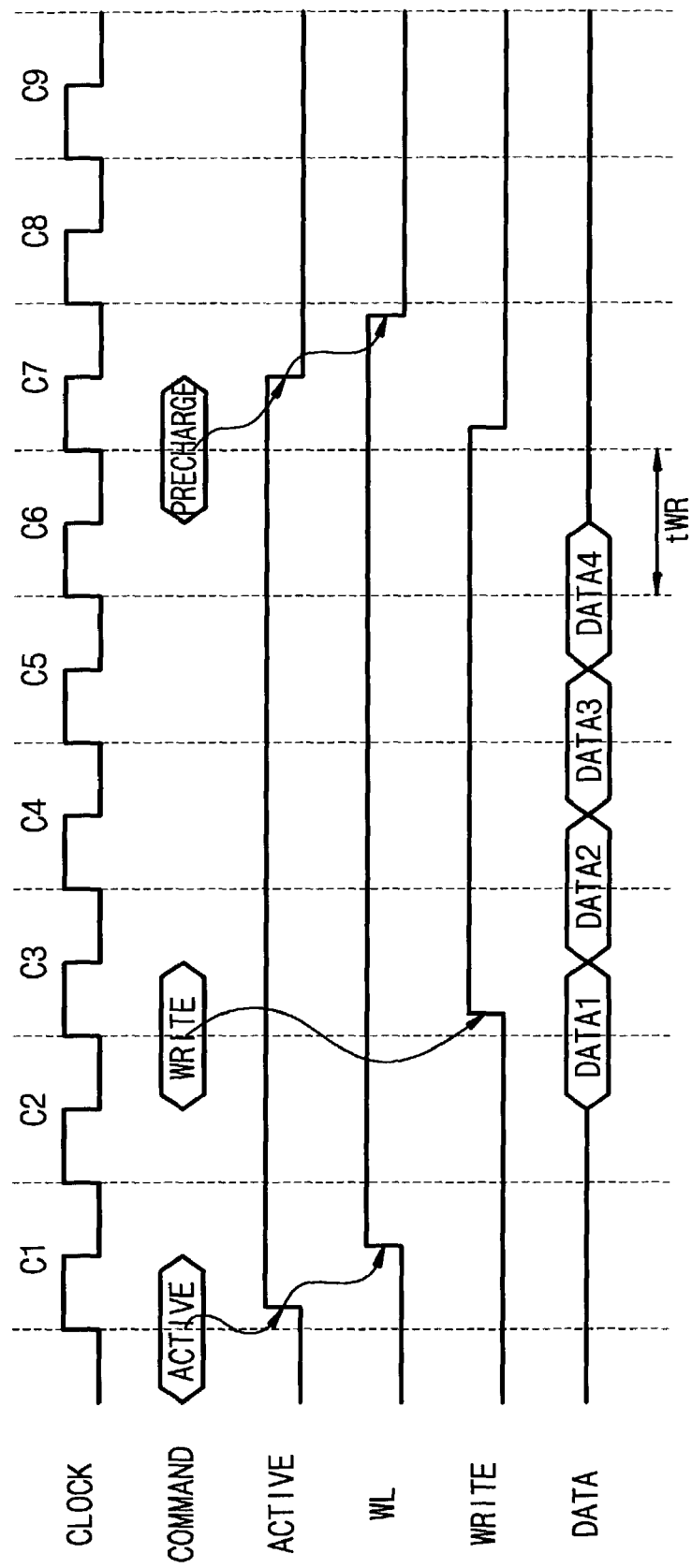
FIG. 2 is a timing diagram that illustrates the operation of the conventional SDRAM of FIG. 1.

It is further noted that although the various embodiments have been applied to an auto-precharge operation, they may also be applied to a precharge operation, such as the precharge operation shown in FIGS. 2, 3A, and 3B.

It is further noted that although various signals in the various embodiments described above as having specific levels, such as high and low levels, these levels could easily be reversed as would be known to one of ordinary skill in the art.

It is further noted the exemplary embodiments illustrated in FIGS. 6 and 8 are exemplary and may be varied in many ways. For example, a number other than two paths could be employed in the exemplary embodiments illustrated in FIGS. 6 and 8. Similarly, for the exemplary embodiment illustrated in FIG. 10, a different number of latency signals and a different number of circuits could be employed.

Although the present invention has been described with reference to exemplary embodiments, it will be apparent to one of ordinary skill in the art that modifications of the described embodiments may be made without departing from the spirit and scope of the invention.

We claim:

1. A circuit comprising:
    an auto-precharge control circuit for varying a write recovery time of a semiconductor device based on an auto-precharge pulse signal and in response to latency information and clock frequency information included in at least one control signal, the auto-precharge pulse signal identifying a starting point for an auto-precharge operation.

2. The circuit of claim 1 said auto-precharge control circuit receives a clock signal, a write signal, an auto-precharge command, an active signal, and said at least one control signal and produces the auto-precharge pulse signal.

3. The circuit of claim 2, wherein said auto-precharge control circuit includes
    a control circuit for receiving the write signal and the control signal and selecting the starting point for the auto-precharge operation in accordance with the at least one control signal.

4. The circuit of claim 2, further including,
    an auto-precharge enabling circuit for receiving the auto-precharge pulse signal and disabling the active signal, thereby starting said auto-precharge operation.

5. The circuit of claim 2, wherein the at least one control signal is generated from an externally supplied mode register setting (MRS) command.

6. The circuit of claim 5, wherein the MRS command further includes at least one of mode information, burst type information, and burst length information.

7. A circuit comprising:
an auto-precharge control circuit for varying a write recovery time of a semiconductor device based on an auto-precharge pulse signal, the auto-precharge pulse signal identifying a starting point for an auto-precharge operation, the write recovery time being varied in response to latency information included in at least one control signal.

8. The circuit of claim 7, wherein the write recovery time is proportional to the latency information.

9. The circuit of claim 7, wherein said auto-precharge control circuit receives a clock signal, a write signal, an auto-precharge command, an active signal, and said at least one control signal and produces the auto-precharge pulse signal.

10. The circuit of claim 7, wherein said auto-pre charge control circuit includes,
a control circuit for receiving the write signal and the control signal and selecting the starting point for the auto-precharge operation in accordance with the at least one control signal.

11. The circuit of claim 7, wherein said auto-precharge control circuit includes,
an auto-precharge enabling circuit for receiving the auto-precharge pulse signal and disabling the active signal, thereby starting said auto-precharge operation.

12. The circuit of claim 7, wherein the latency information is CAS latency information.

13. The circuit of claim 7, wherein the at least one control signal is generated by an externally supplied mode register setting (MRS) command.

14. The circuit of claim 13, wherein the MRS command further includes at least one of mode information, burst type information, and burst length information.

15. A circuit comprising:
an auto-precharge control circuit for varying the number of clock cycles for a write recovery time of a semiconductor device based on an auto-precharge pulse signal, the auto-precharge pulse signal identifying a starting point for an auto-precharge operation, the write recovery time being varied in response to latency information included in at least one control signal.

16. An auto-precharge control circuit, comprising:
a control circuit for receiving a write signal, a clock signal and at least one control signal, including at least one of clock frequency information and latency information, and outputting at least one path signal;
an auto-precharge pulse signal driver for receiving the at least one path signal, the write signal, and an enable signal and producing an auto-precharge pulse signal, the auto-precharge pulse signal identifying a starting point for an auto-precharge operation; and
an auto-precharge mode enabling circuit for receiving the clock signal, an auto-precharge command, an active signal, and the auto-precharge pulse signal and generating the enable signal.

17. The auto-precharge control circuit of claim 16, said auto-precharge mode enabling circuit further comprising:
a feedback signal generator for receiving the auto-precharge pulse signal and outputting a feedback signal to disable the active signal, thereby starting said auto-precharge operation,
an auto-precharge operation selector for forwarding the auto-precharge command in response to the clock signal, the write signal, and the active signal,
said auto-precharge enabling circuit for receiving the active signal and the auto-precharge command and forwarding the enable signal to said auto-precharge pulse signal driver.

18. The auto-precharge control circuit of claim 16, said control circuit including,
a first path including a first switch, receiving the write signal and triggered by the clock signal, and a first latch circuit for generating a first path signal, and
a second path including the first switch, and the first latch circuit of said first path and further including a second switch triggered by the clock signal, a second latch circuit outputting a latch signal and a logic circuit receiving the latch signal and the at least one control signal and generating a second path signal.

19. The auto-precharge control circuit of claim 16, said control circuit including,
at least a first path including a switch triggered by the clock signal, and a latch circuit for generating a first path signal and
a second path including the switch, and the latch circuit of said first path and further including a logic circuit receiving a signal from the latch circuit and the at least one control signal and a delay circuit for delaying the first path signal and generating a second path signal.

20. The auto-precharge control circuit of claim 19, said delay circuit further including, an inverter, a resistor, and a capacitor for outputting the second path signal.

21. The auto-precharge control circuit of claim 16, said control circuit including,
a cascade of circuits in series, each circuit receiving the write signal, the clock signal and at least one control signal, and delaying the write signal by a different amount, depending on the at least one control signal and outputting at least one path signal.

22. The auto-precharge control circuit of claim 21, a first circuit of said cascade of circuits including a NAND gate, an inverter, a switch, a latch circuit, and a switch for generating and outputting a path signal to a subsequent circuit,
subsequent circuits of said cascade of circuits including a NAND gate, a NAND gate, a switch, a latch circuit, and a switch and outputting a path signal to a subsequent circuit, and
a last circuit of said cascade of circuits including a NAND gate, a NAND gate, a switch, and a latch circuit.

23. A method of performing an auto-precharge operation comprising:
varying a write recovery time of a semiconductor device based on an auto-precharge pulse signal and in response to latency information and clock frequency information included in at least one control signal, the auto-precharge pulse signal identifying a starting point for an auto-precharge operation.

24. The method of claim 23, said method further including,
receiving a clock signal, a write signal, an auto-precharge command, an active signal, and said at least one control signal and producing the auto-precharge pulse signal.

25. The method of claim 23, said method further including,
receiving the write signal and the control signal and selecting the starting point for the auto-precharge operation in accordance with the at least one control signal.

26. The method of claim 23, said method further including,
receiving the auto-precharge pulse signal and disabling the active signal, thereby starting said auto-precharge operation.

27. The method of claim 23, wherein the at least one control signal is generated from an externally supplied mode register setting (MRS) command.

28. The method of claim 27, wherein the MRS command further includes at least one of mode information, burst type information, and burst length information.

29. A method of performing an auto-precharge operation comprising
varying a write recovery time of a semiconductor device based on an auto-precharge pulse signal and in response to latency information included in at least one control signal, the auto-precharge pulse signal identifying a starting point for an auto-precharge operation.

30. A method of performing an auto-precharge operation comprising:
varying the number of clock cycles for a write recovery time of a semiconductor device based on an auto-precharge pulse signal and in response to latency information included in at least one control signal, the auto-precharge pulse signal identifying a starting point for an auto-precharge operation.

31. The method of claim 30, wherein the write recovery time is proportional to the latency information.

32. The method of claim 30, said method further including,
receiving a clock signal, a write signal, an auto-precharge command, an active signal, and said at least one control signal, and
producing an auto-precharge pulse signal.

33. The method of claim 30, said method further including,
receiving the write signal and the control signal, and
selecting the starling point for the auto-precharge operation in accordance with the at least one control signal including latency information.

34. The method of claim 30, said method further including,
receiving the auto-precharge pulse signal and disabling the active signal, thereby starting said auto-precharge operation.

35. The method of claim 30, wherein the latency information is CAS latency information.

36. The method of claim 30, wherein the at least one control signal is generated by an externally supplied mode register setting (MRS) command.

37. The method of claim 36, wherein the MRS command further includes at least one of mode information, burst type information, and burst length information.

38. A method of performing an auto-precharge operation, comprising:
an auto-precharge control step for receiving a write signal, a clock signal and at least one control signal, including at least one of clock frequency information and latency information, and outputting at least one path signal;
an auto-precharge pulse signal driving step for receiving the at least one path signal the write signal, and an enable signal and producing an auto-precharge pulse signal, the auto-precharge pulse signal identifying a starting point for an auto-precharge operation; and
an auto-precharge mode enabling step for receiving the clock signal, an auto-precharge command, an active signal, and the auto-precharge pulse signal and generating the enable signal.

39. The method of claim 38, said auto-precharge mode enabling step further comprising:
a feedback signal generating sub-step for receiving the auto-precharge pulse signal and outputting a feedback signal to disable the active signal, thereby starting said auto-precharge operation,
an auto-precharge operation selecting sub-step for forwarding the auto-precharge command in response to the clock signal, the write signal, and the active signal,
an auto-precharge enabling sub-step for receiving the active signal and the auto-precharge command and forwarding the enable signal to said auto-precharge pulse signal driving step.

40. The method of claim 38, said auto-precharge control step including, generating a first path signal by receiving and processing the write signal, triggered by the clock signal, through a first switch and a first latch circuit, and
generating a second path signal by receiving and processing the write signal, triggered by the clock signal, through the first switch, the first latch circuit, a second switch, a second latch circuit, and a logic circuit.

41. The method of claim 38, said auto-precharge control step including, generating a first path signal by receiving and processing the write signal, triggered by the clock signal, through a switch and a latch circuit, and
generating a second path signal by receiving and processing the write signal, triggered by the clock signal, through the switch, the latch circuit, and a logic circuit receiving a signal from the latch circuit and the at least one control signal and a delay circuit for delaying the first path signal and generating the second path signal.

42. The method of claim 41, the delay circuit including, an inverter, a resistor, and a capacitor for outputting the second path signal.

43. The method of claim 38, said auto-precharge control step including, receiving the write signal, the clock signal and at least one control signal in each of a cascade of circuits in series, and delaying the write signal in each of the cascade of circuits by a different amount, depending on the at least one control signal and outputting at least one path signal.

44. The method of claim 43, a first circuit of the cascade of circuits including a NAND gate, an inverter, a switch, a latch circuit, and a switch or generating and outputting a path signal to a subsequent circuit, subsequent circuits of the cascade of circuits including a NAND gate, a NAND gate, a switch, a latch circuit, and a switch and outputting a path signal to a subsequent circuit, and
a last circuit of the cascade of circuits including a NAND gate, a NAND gate, a switch, and a latch circuit.

* * * * *